(12) United States Patent
Linde (10) Patent No.: US 10,794,849 B2
(45) Date of Patent: Oct. 6, 2020

(54) STRUCTURAL COMPONENT AS WELL AS SYSTEM AND METHOD FOR THE DETECTION OF DAMAGE

(71) Applicant: Airbus Operations GmbH, Hamburg (DE)

(72) Inventor: Peter Linde, Hamburg (DE)

(73) Assignee: Airbus Operations GmbH (DE)

( * ) Notice: Subject to any disclaimer, the term of this patent is extended or adjusted under 35 U.S.C. 154(b) by 0 days.

(21) Appl. No.: 16/396,990

(22) Filed: Apr. 29, 2019

(65) Prior Publication Data

US 2019/0331627 A1    Oct. 31, 2019

(30) Foreign Application Priority Data

Apr. 30, 2018 (DE) .................. 10 2018 206 665

(51) Int. Cl.
| | | |
|---|---|---|
| *G01N 27/20* | (2006.01) | |
| *G01N 27/04* | (2006.01) | |
| G01N 27/00 | (2006.01) | |
| B32B 27/12 | (2006.01) | |
| B32B 27/40 | (2006.01) | |
| B64D 45/00 | (2006.01) | |

(52) U.S. Cl.
CPC ........... *G01N 27/20* (2013.01); *G01N 27/041* (2013.01); *B32B 27/12* (2013.01); *B32B 27/40* (2013.01); *B32B 2307/202* (2013.01); *B32B 2457/00* (2013.01); *B64D 2045/0085* (2013.01)

(58) Field of Classification Search
CPC ...... G01N 27/20; G01N 27/041; B32B 27/12; B32B 27/40; B32B 2307/202; B32B 2457/00; B32B 2045/0085

USPC ......................................................... 73/774
See application file for complete search history.

(56) References Cited

U.S. PATENT DOCUMENTS

| | | | |
|---|---|---|---|
| 7,246,521 B2 | 7/2007 | Kim | |
| 8,164,232 B2 * | 4/2012 | Kornbluh | H02N 1/00 310/309 |
| 2001/0032663 A1 * | 10/2001 | Pelrine | F02G 1/043 136/205 |
| 2001/0035723 A1 * | 11/2001 | Pelrine | F02G 1/043 318/116 |
| 2005/0040733 A1 * | 2/2005 | Goldenberg | F04B 43/09 310/328 |
| 2007/0166831 A1 | 7/2007 | Watkins et al. | |
| 2010/0036567 A1 * | 2/2010 | Gandhi | B60N 2/002 701/49 |

(Continued)

FOREIGN PATENT DOCUMENTS

| | | |
|---|---|---|
| DE | 10 2015 218891 A1 | 3/2017 |
| WO | 2016/156175 A1 | 10/2016 |

*Primary Examiner* — Max H Noori
(74) *Attorney, Agent, or Firm* — Lerner, David, Littenberg, Krumholz & Mentlik, LLP (57) ABSTRACT

A structural component has a plurality of material layers, which are stacked and bonded together in a thickness direction, wherein at least one of the material layers is formed by a fibre composite material, and wherein an outermost material layer in relation to the thickness direction is formed at least in sections by a sensor device, having at least one sensor unit with an electroactive polymer arranged between electrically conductive electrodes. Moreover, a system and a method for the detection of damage and an aircraft are described.

15 Claims, 3 Drawing Sheets

(56) References Cited

U.S. PATENT DOCUMENTS

2011/0241704 A1  10/2011  Laflamme et al.
2012/0265449 A1  10/2012  Ihn et al.

* cited by examiner

STRUCTURAL COMPONENT AS WELL AS SYSTEM AND METHOD FOR THE DETECTION OF DAMAGE

FIELD OF THE INVENTION

The present invention relates to a structural component, a system for the detection of damage, an aircraft with such a system and a method for the detection of damage of a structural component.

BACKGROUND OF THE INVENTION

Fibre composite materials offer great benefits in terms of weight and strength. Structural components made of fibre composite materials generally have a layered construction, wherein several fibre composite layers which are stacked and joined together by bonding are provided. Such components are often used in aircraft, for example as stringers, bulkheads, skin segments, or the like.

In the layered construction it is important to reliably prevent a local separation or detachment of the individual layers from one another, which is known as delamination.

In order to check the mechanical properties of a structural component, it is described in U.S. Pat. No. 7,246,521 B2 to attach a plurality of piezoelements to the structural component, the piezoelements being provided to excite and detect vibrations. From a detected vibration plot, damage to the component can be inferred. Such systems are also known as health monitoring systems.

US 2012/0265449 A1 likewise describes a health monitoring system for a fibre composite component in which sensors are arranged between two layers of the component in order to detect the integrity of an adhesive coat bonding the layers together.

US 2007/0166831 A1 describes a fibre composite component on whose surface a resistive sensor is formed by a local introduction of electrically conductive particles into a matrix material. By detecting a change in the electrical resistance of the sensor, the presence of damage to the component can be inferred.

BRIEF SUMMARY OF THE INVENTION

A problem which aspects of the present invention propose to solve is to further develop the known concepts for the detection of damage to a fibre composite component.

According to a first aspect of the invention, a structural component is provided. The structural component according to an embodiment of the invention comprises a plurality of preferably sheet-like extending material layers, which are stacked and bonded together in a thickness direction, especially mechanically interconnected, for example by bonding or in general cohesive manner.

At least one of the material layers is formed by a fibre composite material. An outermost material layer in relation to the thickness direction, that is, an outer cover layer of the structural component, is formed at least in sections or in regions by a sensor device, having at least one sensor unit with an electroactive polymer arranged between electrically conductive electrodes.

One fundamental idea of the present invention accordingly is that a cover layer of a fibre composite component having several layers is to be formed at least in regions as a sensor layer by one or more sensor units having an electroactive polymer material (in short, EAP). EAPs are polymer materials which change their shape when an electrical voltage is applied. Conversely, EAPs are also able to generate an electrical potential difference under deformation. These properties are utilized in the present invention by providing an outermost layer of a fibre composite component, having one or more fibre composite layers, with a sensor device having one or more sensor units with an EAP material arranged between two electrodes. The sensor unit is thus constructed in the manner of a capacitor. When the structural component is deformed, the sensor unit is likewise deformed and a change in the electrical voltage at the electrodes can be detected by virtue of the properties of the EAP material. In the case of a delamination of the region of the outermost layer formed by the sensor unit, the deformation state of the sensor unit and thus the electrical voltage at the electrodes also changes, as a result of which the delamination can be detected.

Since the sensor device forms part of the outermost layer or the cover layer of the structural component, i.e., at the same time it forms part of the surface of the structural component, a complete structural integration of the sensor device in the component is achieved. This is advantageous in terms of the mechanical stability of the structural component, since EAP materials have a comparable mechanical strength to that of the fibre composite layers. Moreover, by virtue of the integration of the sensor device in the layered structure as part of the outermost material layer, it is not necessary to mount sensors as separate, additional components on a complete layered structure. This saves on weight and space and also reduces the manufacturing expense.

Since EAP materials, as described above, generate an electrical potential difference under deformation, a generation of measurement signals by the at least one sensor unit of the sensor device is possible without an electrical power supply. In particular, no electrical voltage source is needed to supply the sensor device. This saves on additional weight. Furthermore, the detection is not dependent on the operating state of an electrical power supply, as a result of which the reliability of the sensor device is improved.

According to one embodiment of the structural component, the sensor device forms the entire surface of the outermost material layer. Thus, the entire cover layer of the structural component can be formed as the sensor device. Thus, since one or more sensor units are present over the entire two-dimensional extension of the cover layer, a delamination or damage of the structural component can be detected regardless of where this occurs in relation to the two-dimensional extension. This further improves the reliability with which a delamination can be ascertained or detected.

According to another embodiment, the at least one sensor unit is in the form of a band. That is to say, the at least one sensor unit has an extension in a lengthwise direction (a lengthwise extension) which is much greater than an extension of the sensor unit in a width direction (a width extension) running transversely to the lengthwise direction. For example, the lengthwise extension may be at least twice, especially at least five times and preferably at least ten times the width extension. The band-like construction of the sensor unit as a sensor band affords the benefit that the sensor unit can be laid on already stacked material layers of the structural component by means of a laying head, as is customary for the laying of fibre bands to create the fibre composite layers of the structural component. This facilitates the production of the structural component. A further benefit is that a plurality of sensor bands can be arranged alongside each other, whereby a damage such as a delamination can be detected with local resolution.

According to a further embodiment of the structural component, in addition to the outermost material layer, also a first inner material layer directly adjoining the outermost material layer in the thickness direction is formed at least in sections by the sensor device. The first inner material layer is thus connected directly to the outermost material layer. The at least partial formation of the two outermost material layers as a sensor unit further heightens the reliability of the detection of damage of the structural component.

Optionally at least one sensor unit is provided respectively in the first inner material layer and the outermost material layer. Preferably, the sensor units arranged in the outermost material layer and those arranged in the first inner material layer are in each case formed as bands and cross over each other. Thus, at least a first sensor band is provided as the sensor unit in the outermost material layer, which extends in a first direction, and at least one second sensor band is provided as the sensor unit in the adjacent first inner material layer, which extends in a second direction, wherein the first and the second direction run across one another. In this way, upon deformation of the structural component, different potential differences will be generated on the electrodes of the first and second sensor bands, depending on the direction of the deformation. Thus, detected damage can be assigned to a particular direction of deformation. Moreover, the local resolution of damage can be further improved and by comparing the detected voltages at the electrodes, a verification of the functional capability of the individual sensor units is possible in an easy manner. Thus, the reliability of the damage detection is further improved.

According to a further embodiment of the structural component, the electroactive polymer is a dielectric electroactive polymer, in particular a thermoplastic polyurethane elastomer, such as the material designated as Epurex LPT 4207 CU-T.

According to a further embodiment, the electrodes of the sensor unit are formed from an electrically conductive polymer, especially from a poly(3,4-ethylenedioxythiophene)/polystyrene sulfonate material. This material may be abbreviated as PEDOT/PSS. Poly(3,4-ethylenedioxythiophene) is produced from 2,5-linked 3,4-ethylenedioxythiophene (EDOT) units. PEDOT/PSS is prepared by the oxidation of EDOT by catalytic quantities of iron (III) sulphate in water.

According to a further aspect of the invention, a system is provided for the detection of damage, having a structural component according to one of the described embodiments above and at least one voltage measuring device, which is connected to the electrodes of the at least one sensor unit, in order to measure an electrical voltage present between the electrodes.

According to this system, the at least one sensor unit forms part of a closed circuit, wherein by means of the voltage measuring device a voltage established between the electrodes as a result of deformation of the EAP material is detected by the voltage measuring device.

According to one embodiment of the system, a number of voltage measuring devices corresponding to the number of sensor units is provided and a voltage measuring device is connected to the electrodes of each sensor unit. In this way, the voltage created at each sensor unit can be detected individually, with the result that the reliability of the system is further improved.

According to a further embodiment of the system, a deformation detecting device is additionally arranged on the structural component to detect a deformation of the structural component, for example in the form of a strain gauge strip (SGS). The detection of the mechanical deformation of the structural component makes it easier to associate a detected voltage change at the electrodes of the sensor device with a delamination, since by comparing a plot of a voltage change with a plot of a deformation it is possible to recognize whether the voltage change is due to a change in the deformation or a delamination.

According to a further aspect of the invention, an aircraft is provided having a system according to one of the embodiments described above. The structural component can herein be formed in particular as a bulkhead or a stringer, i.e., especially as a profiled beam, or as a skin segment of the aircraft. In general, the structural component may form a body member of the aircraft.

According to a further aspect of the invention, a method is provided for the detection of damage of a structural component. According to an aspect of the invention, in a structural component formed according to one of the embodiments described above, shear forces are generated along boundary surfaces of the material layers by mechanical deformation of the structural component. This includes subjecting the structural component to a force or a torque. The deformation creates shear stresses along the contact surfaces of neighbouring interconnected material layers. Furthermore, a detection of an electrical voltage at the electrodes of the at least one sensor unit of the sensor device is realized over a predetermined period of time and an analysis of a resulting plot of the electrical voltage over the predetermined period of time is realized in regard to the existence of a damage criterion indicative of damage.

According to this method, therefore, the voltage generated by the deformation of the EAP material of the at least one sensor unit is detected and the voltage plot obtained over a certain period of time is analyzed in order to infer damage of the component. For example, the voltage plot can be detected during the entire flight of an aircraft. If a delamination of the sensor device from the underlying material layer occurs, this is visible as a change in the voltage plot. The analysis thus includes the identification of a curve pattern in the voltage plot as a damage criterion and it can be realized for example with the aid of evaluation software.

According to one modification of the method, the damage criterion is fulfilled when one of the following curve patterns of the voltage plot is present:
a) a change in the voltage plot,
b) a change in the voltage plot as compared to a plot of a deformation of the structural component detected over the predetermined period of time,
c) a deviation of the voltage plot in a first partial period of time of the predetermined period of time from the voltage plot in a second, later partial period of time of the predetermined period of time.

If one or more of these curve patterns is detected, the damage criterion is fulfilled and it is determined that damage to the structural component is present. The above criterion a) is especially suitable when used in material experiments, in which the structural component is deformed in one direction until a delamination occurs. Criterion b) affords the benefit that it can be directly determined whether a voltage change is attributable to a decline in the deformation, which is detected with a deformation measuring device such as a strain gauge strip, or to a delamination. This is especially advantageous when lengthy periods of time need to be evaluated, during which the structural component is subjected to changing deformation states, such as during a flight of an aircraft for example. The criterion can be determined mathematically with very low expense, for example by comparing the sign of a deformation gradient versus time and a voltage gradient versus time. Criterion c), like criterion b), affords the benefit that lengthy periods of time can be evaluated reliably. Criterion c) is fulfilled if different voltage plots result for the same deformation plots. This can be used especially advantageously for periodically occurring deformations. After a delamination, the deformation behaviour of the sensor unit and thus the detected voltage is changed for a repeated identical deformation of the structural component, which can be used as a criterion for damage.

In regard to the directional indications and axes, especially the directional indications and axes regarding the profile of physical structures, a profile of an axis, a direction, or a structure "along" another axis, direction, or structure is here understood to mean that these, and especially the tangents occurring at a particular point of the structures, in each case run at an angle of less than 45 degrees, preferably less than 30 degrees, and especially preferably run parallel to each other.

In regard to the directional indications and axes, especially the directional indications and axes regarding the profile of physical structures, a profile of an axis, a direction, or a structure "transversely" to another axis, direction, or structure is here understood to mean that these, and especially the tangents occurring at a particular point of the structures, run at an angle greater than or equal to 45 degrees, preferably greater than or equal to 60 degrees, and especially preferably run perpendicular to each other.

A "fibre material" or a "fibre composite material" is here understood to mean in general a material formed from a plurality of reinforcement fibres, especially in the form of filaments or pieces of filaments, such as carbon, glass, ceramic, aramide, boron, mineral, natural or synthetic fibres or mixtures thereof. The fibre material can also be impregnated in particular with a resin or matrix material such as a thermosetting, thermoplastic, elastomer resin or generally a plastic resin or the like.

BRIEF DESCRIPTION OF THE DRAWINGS

In the following, the invention will be explained with reference to the figures of the drawings. The figures show.

DETAILED DESCRIPTION

In the figures, the same reference numbers denote the same or functionally identical components, unless otherwise stipulated.

Figure 1:
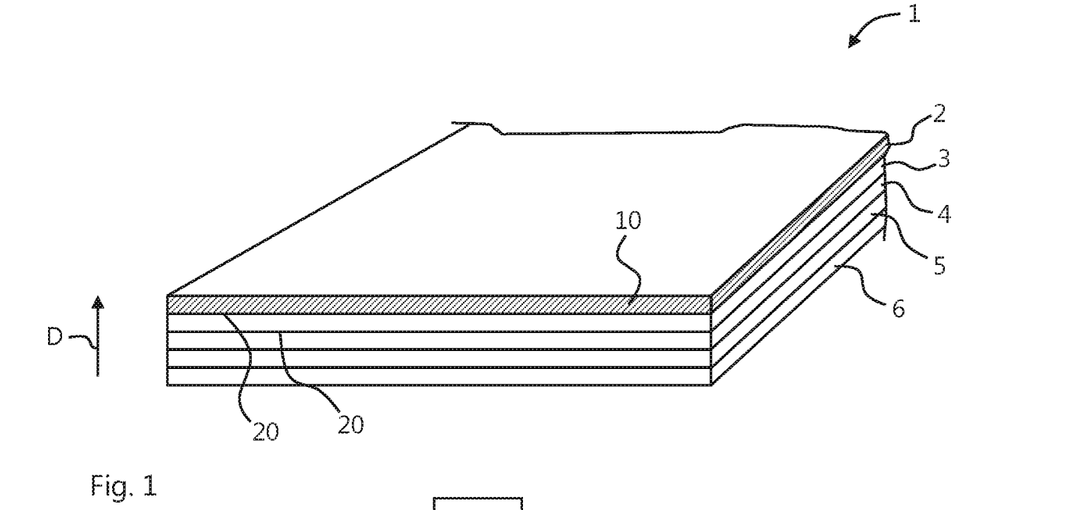
FIG. 1 a perspective view of a structural component according to one exemplary embodiment of the present invention.

FIG. 1 shows schematically a structural component 1. The structural component 1 has a plurality of material layers 2, 3, 4, 5, 6. The material layers or plies 2, 3, 4, 5, 6 are realized each time as sheet-like extending mats or bands, lying against each other flat or stacked in a thickness direction D running transversely to the sheet-like extension of the material layers 2, 3, 4, 5, 6. The material layers 2, 3, 4, 5, 6, in particular every two immediately consecutive material layers, are joined together, for example bonded or generally cohesively joined together. In particular, every two adjacent material layers 2, 3, 4, 5, 6 make contact with each other at respective boundary surfaces 20. One or more of the material layers 3, 4, 5, 6 are formed by a fibre composite material. In FIG. 1, for example, the material layers 3, 4, 5 and 6 are formed as fibre composite layers and are joined together by an integral bonding of a matrix material surrounding reinforcement fibres of the particular material layer.

As is furthermore shown in FIG. 1, an outermost material layer 2 in relation to the thickness direction D, which can also be called a first cover layer, is formed as a sensor device 10. Alternatively or additionally, the outermost material layer 6 in relation to the thickness direction D which is situated opposite to the first cover layer 2 may be formed as a sensor device 10 or comprise such a device. The material layer 6 forms a second cover layer. In FIG. 1 as an example it is shown that the entire outermost material layer 2 is formed by the sensor device 10. Alternatively, only a partial region of the outermost material layer 2 may also be formed by the sensor device 10, as is shown for example in FIGS. 7 and 9. Generally the outermost material layer 2 is formed at least in regions by a sensor device 10.

Figure 6:
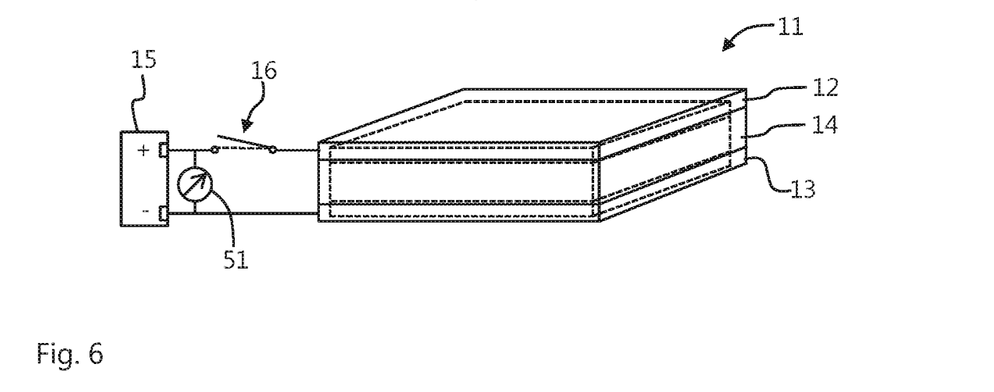
FIG. 6 a sensor unit of a sensor device of a structural component according to an exemplary embodiment of the present invention.

The sensor device 10 comprises at least one sensor unit 11. FIG. 6 shows schematically the make-up of the sensor unit 11. As can be seen in FIG. 6, the sensor unit 11 has a first electrode 12, a second electrode 13 and electroactive polymer material 14, EAP 14 for short. As shown in FIG. 6, the electrodes 12, 13 are realized as plate-like, sheet-like extending components. The EAP 14 is arranged between the electrodes 12, 13 in relation to their sheet-like extension. The EAP 14 may in particular be a dielectric electroactive polymer, preferably a thermoplastic polyurethane elastomer. The electrodes 12, 13 may be formed for example from an electrically conductive polymer.

In order to explain the functional principle of the sensor unit 11, FIG. 6 shows an electrical voltage source 15, whose poles can be connected via a switch 16 to the electrodes 12, 13. If an electrical voltage U is applied to the electrodes 12, 13, i.e., if the switch 16 is closed, as represented by a broken line in FIG. 6, a lessening of the distance between the electrodes 12, 13 and a contraction of the EAP 14 will occur. This relationship between the voltage U applied to the electrodes 12, 13 and the contraction may be utilized to detect damage B, since a contraction of the EAP 14 results in a change in the voltage U which can be detected between the electrodes 12, 13. This will be explained in further detail below.

Figure 7:
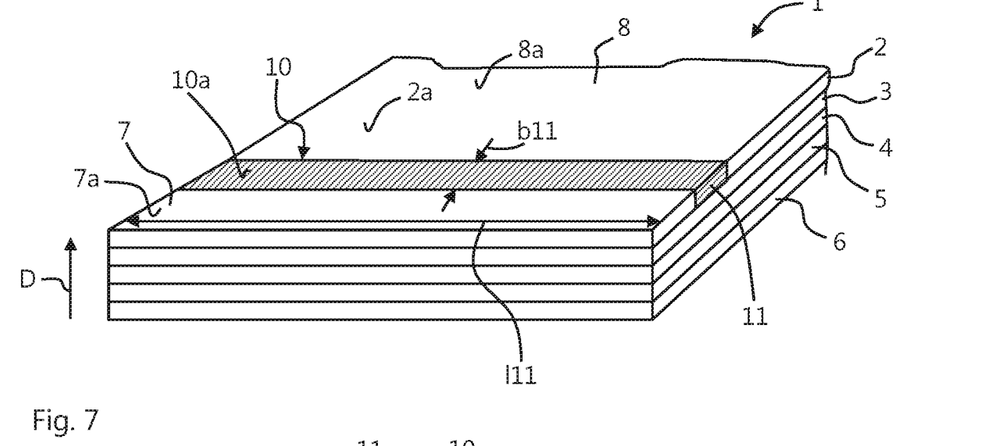
FIG. 7 a perspective view of a structural component according to another exemplary embodiment of the present invention.

As already mentioned and shown as an example in FIG. 1, the sensor device 10 may form the outermost material layer 2 entirely or for the entire surface. FIG. 7 shows as an example that at least a partial region of the outermost material layer 2 is realized as a sensor device 10. In the latter instance, the remaining portion of the outermost material layer 2 is formed by one or more material mats 7, 8, for example made from a fibre composite material. Optionally, an outer surface 10*a* of the sensor device 10 steadily continues an outer surface 7*a*, 8*a* of the material mats 7, 8, as shown for example in FIG. 7. The outer surface 10*a* of the sensor device 10 thus forms a portion of the surface 2*a* of the outermost material layer 2.

As is shown for example in FIGS. 1 and 7, the sensor device 10 may comprise a single sensor unit 11. In FIG. 1, the sensor unit 11 is formed as a flat cut piece forming the entire outermost material layer 2. In FIG. 7, the sensor unit 11 is in the form of a band, i.e., realized as a sensor band. Such a sensor band may have a width b11, for example, which is at most 50 percent of a length l11 of the sensor band, especially at most 20 percent and preferably at most 10 percent of the length l11 of the sensor band.

Figures 8, 9:
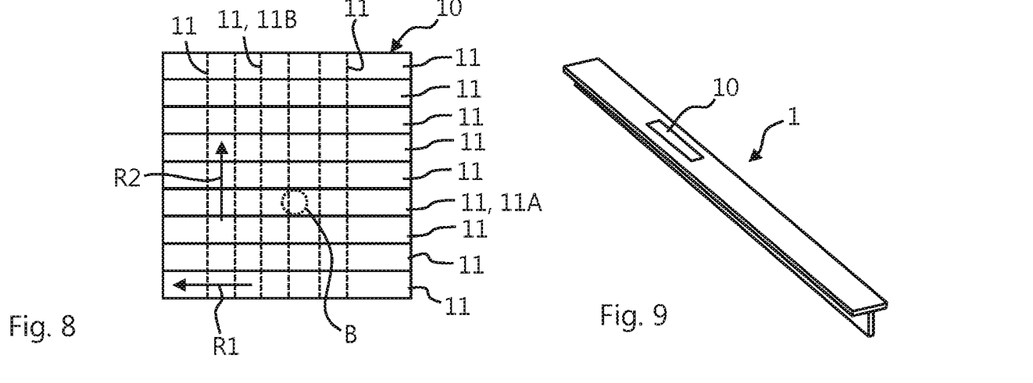
FIG. 8 a top view of an outermost material layer of a structural component according to another exemplary embodiment of the present invention.
FIG. 9 a perspective view of a structural component according to an exemplary embodiment of the present invention.

As is shown for example in FIG. 8, it may also be provided that the sensor device 10 comprises several sensor units 11. In FIG. 8, the sensor units 11 are likewise in the form of bands. Moreover, also in FIG. 8 the entire outermost material layer 2 is formed by the sensor device 10. For this, a plurality of sensor units 11 formed as bands are arranged alongside each other. Moreover, FIG. 8 shows by broken lines that in addition to the outermost material layer 2, also a first inner material layer 3 adjoining the outermost material layer 2 in the thickness direction D may be formed at least in regions by the sensor device 10. For example, the material layer indicated in FIG. 1 by the reference number 3 may also be realized in whole or in part by the sensor device 10. As is shown for example in FIG. 8, a portion of the first inner material layer 3 may likewise contain at least one sensor unit 11 for this purpose. For example, it is shown in FIG. 8 that the first inner material layer 3 has three sensor units 11 formed as bands, respectively shown by broken lines and arranged at a spacing from each other. Of course, the entire first inner material layer 3 may also be formed by a single sensor unit 11 or by a plurality of sensor units 11 formed as bands. In general, at least one sensor unit 11 can be provided respectively in the first inner material layer 3 and the outermost material layer 2.

As is furthermore shown in FIG. 8, it is optionally provided that the sensor units 11 formed as bands arranged in the outermost material layer 2 and those in the first inner material layer 3 cross over each other, i.e., they run along crossing directions R1, R2.

FIG. 9 shows for example a structural component 1 realized as a profiled beam. The structural component 1 shown for example in FIG. 9 has a T-shaped cross section and can be used for example as a stringer in an aircraft 100. As is further shown in FIG. 9, the sensor device 10 may form only a partial region of the outermost material layer 2 of the structural component 1 and be situated in a middle region for example in relation to a lengthwise extension of the structural component 1. This is advantageous, since typically the strongest deformations occur in this region. In general, the sensor device 10 may be arranged in a region of the structural component 1 where strong deformations are expected and which is therefore prone to damage.

Figure 2:
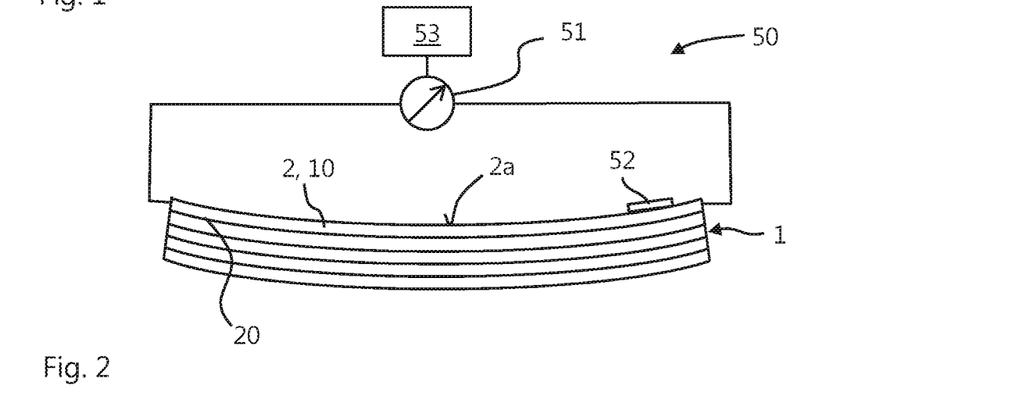
FIG. 2 a schematic view of a system for the detection of damage according to one exemplary embodiment of the present invention, where a structural component of the system finds itself in a first deformation state.

By means of a structural component 1 as described with the aid of FIGS. 1, 7, 8 and 9, a system 50 can be realized in an easy manner for the detection of damage B, such as a delamination of the outermost material layer 2. FIG. 2 shows such a system 50 schematically, having in addition to the structural component 1 at least one voltage measuring device 51 and optionally a deformation detecting device 52, such as a strain gauge strip for example.

As can be seen in FIG. 6, the voltage measuring device 51 is connected to the electrodes 12, 13 of the at least one sensor unit 11, in order to measure an electrical voltage U present between the electrodes 12, 13. In the event that the sensor device 10 comprises several sensor units 11, such as in FIG. 8, a number of voltage measuring devices 51 corresponding to the number of sensor units 11 can be provided in particular. In this case, a voltage measuring device 51 is connected to the electrodes 12, 13 of each sensor unit 11.

The optional deformation detecting device 52 is arranged on the structural component 1. As shown for example in FIG. 2, the deformation detecting device 52 may be arranged in particular on the outer surface 2*a* of the outermost material layer 2 of the structural component 1.

By means of this system 2, damage B to the structural component 1 can be detected. In FIG. 2, the structural component 1 is shown in a first deformation state, while in FIG. 2 a sheet-like bending is represented as an example of the deformation state. In order to produce this exemplary deformation state, the structural component 1 was subjected to a bending moment. The deformation of the structural component generates shear forces or shear stresses along the boundary surfaces 20 of the material layers 2, 3, 4, 5, 6.

Figure 3:
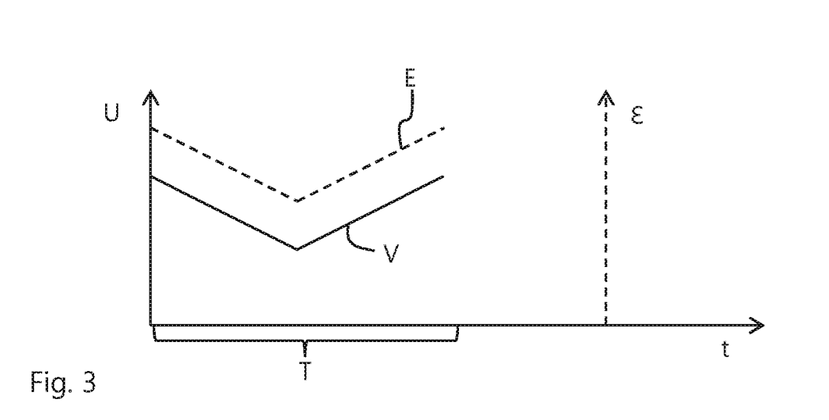
FIG. 3 a diagram showing schematically a voltage plot against time generated by means of a sensor device of a structural component according to an embodiment of the present invention and a deformation plot against time of a structural component according to an embodiment of the present invention.

FIG. 3 shows schematically and as an example the time variation in the electrical voltage U detected at the electrodes 12, 13 of a sensor unit 11 of the sensor device 10 by means of the voltage measuring device 51, such as results when the structural component 1 is deformed from a starting state into the first deformation state and back again. This voltage plot V is shown as a solid line for a predetermined period of time T in FIG. 3. Furthermore, FIG. 3 shows as a broken line the variation in a measure c of the deformation of the structural component 1 over the predetermined period of time T. This deformation plot E is shown as a broken line. The measure c of the deformation may be, for example, a strain in the outermost material layer 2 detected by means of the optional strain gauge strip 52.

As can be seen in FIG. 2, no damage occurs on account of the deformation of the structural component 1 in the first deformation state. Owing to the deformation of the structural component 1, the outermost material layer 2 is deformed and in the example of FIG. 2 it is buckled or compressed in particular. This is evident in FIG. 3 from a decrease in the strain $\varepsilon$. Moreover, the deformation of the outermost material layer 2 results in a deformation of the sensor unit 11 and thus to a change in the voltage U measured between the electrodes 12, 13. As an example, FIG. 3 shows a decrease in the measured voltage U over time with increasing deformation ε (both the strain and the voltage U decrease). If no damage B is present, the structural component 1 returns to its starting state once more due to the decrease in the active mechanical loading. That is to say, the deformation c decreases once more over time. This can be seen in FIG. 3 as a result of the reduced buckling of the outermost material layer 2 due to an increase in the strain ε. The measured voltage U at the electrodes 12, 13 likewise returns accordingly to the starting value.

Figure 4:
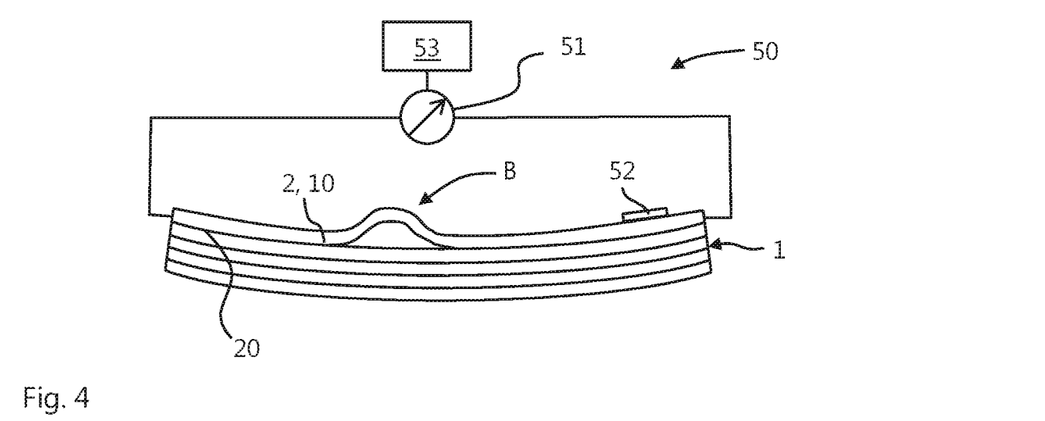
FIG. 4 a schematic view of the system of FIG. 2, where the structural component of the system finds itself in a second deformation state, in which a delamination of an outermost material layer of the structural component is present.

FIG. 4 shows as an example a second deformation state of the structural component 1 in which damage B is present in the form of a delamination of the outermost material layer 2 from the first inner material layer 3. As can be seen in FIG. 4, the outermost material layer 2, formed at least partly by the sensor device 10, is partly separated from the material layer 3 underneath it as a result of the deformation. Thus, the mechanical connection between two adjacent material layers 2, 3 has been at least partly eliminated, which is known as delamination. Accordingly, the deformation of the outermost material layer 2 no longer corresponds entirely to that of the further material layers 3, 4, 5, 6 of the structural component 1.

The occurrence of damage B can be detected by means of the sensor device 10, in that the voltage measuring device 51 detects the electrical voltage U established between the electrodes 12, 13 of the at least one sensor unit 11 over a predetermined period of time T and the resulting voltage plot V against time. Optionally, the deformation plot E against time is also detected in addition, as described above, by means of the strain gauge strip 52.

Figure 5:
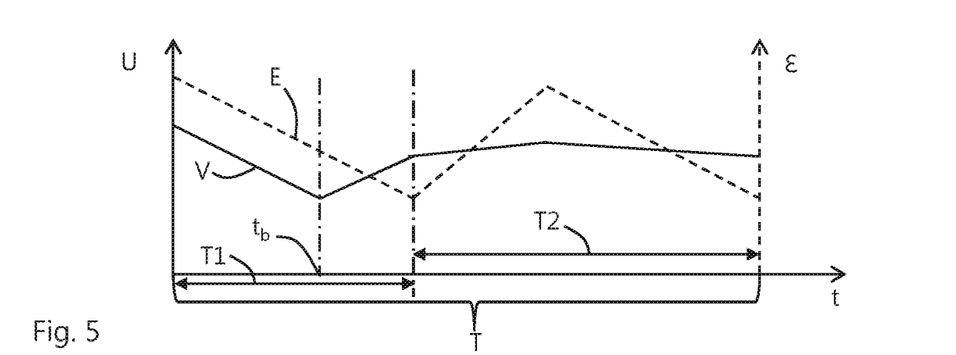
FIG. 5 a diagram showing schematically a voltage plot against time generated by means of the sensor device of the structural component according to an embodiment of the present invention and a deformation plot against time of a structural component according to an embodiment of the present invention, where a damage criterion is fulfilled in the voltage plot shown.

FIG. 5 shows schematically the voltage plot V and the deformation plot E over a predetermined period of time T, such as result from a twice repeated deformation of the structural component 1 into the deformation state shown in FIG. 4, when damage B in the form of a delamination occurs during the first deformation.

In FIG. 5 it can be seen that the structural component 1 is deformed during a first partial period of time T1 into the state shown in FIG. 4. The strain detected by means of the strain gauge strip 52 diminishes steadily, since the outermost material layer 2 is buckled by the deformation. This buckling at the same time results in a decrease in the voltage U up to a time $t_B$ at which the damage B occurs. As a result of the delamination, the buckling of the outer material layer 2 is reduced and so is the buckling or deformation of the EAP 14 of the sensor unit 11. In the present instance, this leads to an increase in the voltage U, even though the structural component 1 continues to be deformed, as is evident from the further decrease in the strain c in FIG. 5.

Hence, the voltage plot V can be analyzed for a change in the voltage plot V, which represents an example of the existence of a damage criterion indicative of damage B. A further damage criterion, whose existence can be determined by analysis of the voltage plot V and the deformation plot E, furthermore results from a change in the voltage plot V as compared to the deformation plot E of the structural component 1, for example when the magnitude of the difference between the time gradient of the deformation plot E and the time gradient of the voltage plot V reaches or exceeds a predetermined boundary value.

The analysis generally involves the identification of a curve pattern in the voltage plot V as a damage criterion and it can be realized for example with the aid of an evaluating device 53. The evaluating device 53 for example may comprise a processor and a memory, on which an evaluation software is stored.

As is further evident in FIG. 5 with the aid of the deformation plot E, a deformation of the structural component 1 back into its starting state and again into the second deformation state shown for example in FIG. 4 occurs during a second, later period of time T2. As is evident in FIG. 5, the detected voltage U despite the deformation of the structural component 1 only changes to a lesser extent than was the case during the first partial period of time T1 up until the time $t_B$. This produces a further damage criterion due to a deviation of the voltage plot V in the first partial period of time T1 from the voltage plot V in a second, later partial period of time T2.

Given this background, once again reference is made to FIG. 8, in which a damage B is shown symbolically by a dashed circle. If this damage B occurs during a deformation of the structural component 1, a change in the voltage plot V is recorded both via the electrodes 12, 13 of the sensor unit 11A, forming part of the outermost material layer 2, and also via the electrodes 12, 13 of the sensor unit 11B, forming part of the first inner material layer 3, through the corresponding voltage measuring devices 51. Thus, a damage criterion is present in the recorded voltage plot of the sensor units 11A, 11B. Due to the mutual crossing of the sensor units 11A, 11B realized as bands, geometrical overlapping regions of the sensor units 11A, 11B are produced. In this way, the damage B can be localized as being situated in this overlapping region.

Figure 10:
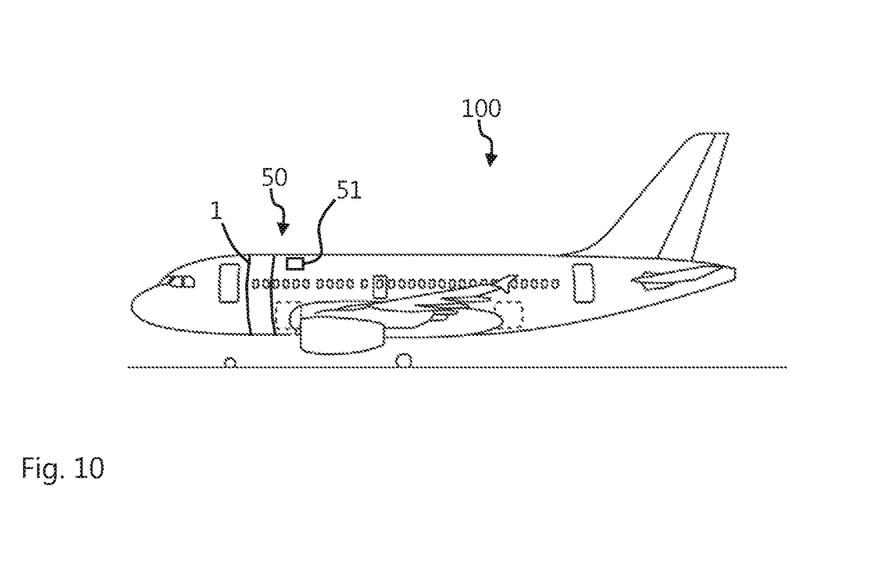
FIG. 10 a schematic view of an aircraft according to an exemplary embodiment of the present invention.

FIG. 12 shows schematically an aircraft 100, having the system 50 for the detection of damage. The structural component 1 here is shown as a skin segment of an outer skin of the aircraft, for example. The voltage measuring device 51 is indicated only schematically as a block.

Although the present invention has been explained above with the aid of exemplary embodiments, it is not confined to them, but rather can be modified in diverse ways. In particular, combinations of the above exemplary embodiments are also conceivable.

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

LIST OF REFERENCE SYMBOLS

1 Structural component
2 Outermost material layer
2a Surface of the outermost material layer
3-6 Material layers
7, 8 Material mats
7a, 8a Surfaces of the material mats
10 Sensor device
10a Outer surface of the sensor device
11 Sensor unit
12, 13 Electrodes of the sensor unit
14 Electroactive polymer 15 Electrical voltage source
20 Boundary surfaces of the material layers
50 System
51 Voltage measuring device
52 Deformation detecting device
53 Evaluating device
B Damage
D Thickness direction
E Deformation plot of the structural component
ε Strain
R1 First direction
R2 Second direction
t Time
$t_B$ Time of the damage
T Predetermined period of time
T1 First partial period of time
T2 Second, later partial period of time
U Electrical voltage
V Voltage plot

The invention claimed is:

1. A structural component having a plurality of material layers, which are stacked and bonded together in a thickness direction;
   wherein at least one of the material layers comprises a fibre composite material, and
   wherein an outermost material layer of the plurality of material layers in relation to the thickness direction comprises at least in sections a sensor device having at least one sensor unit with an electroactive polymer arranged between first and second electrically conductive electrodes.

2. The structural component according to claim 1, wherein the sensor device forms the entire surface of the outermost material layer.

3. The structural component according to claim 1, wherein the at least one sensor unit is in the form of a band.

4. The structural component according to claim 1, wherein in addition to the outermost material layer, also a first inner material layer adjoining the outermost material layer in the thickness direction comprises at least in sections the sensor device.

5. The structural component according to claim 4, wherein at least one sensor unit is provided respectively in the first inner material layer and the outermost material layer.

6. The structural component according to claim 5, wherein the sensor units arranged in the outermost material layer and those arranged in the first inner material layer are in each case formed as bands and cross over each other.

7. The structural component according to claim 1, wherein the electroactive polymer is a dielectric electroactive polymer.

8. The structural component according to claim 7, wherein the electroactive polymer is a thermoplastic polyurethane elastomer.

9. The structural component according to claim 1, wherein the first and second electrically conductive electrodes of the sensor unit are formed from an electrically conductive polymer.

10. A system for the detection of damage, comprising:
    a structural component having a plurality of material layers, which are stacked and bonded together in a thickness direction;
    wherein at least one of the material layers comprises a fibre composite material, and
    wherein an outermost material layer in relation to the thickness direction comprises at least in sections a sensor device having at least one sensor unit with an electroactive polymer arranged between first and second electrically conductive electrodes; and
    at least one voltage measuring device connected to the first and second electrically conductive electrodes of the at least one sensor unit, in order to measure an electrical voltage present between the electrodes.

11. The system according to claim 10, further comprising a number of voltage measuring devices corresponding to the number of sensor units,
    wherein the at least one voltage measuring device is connected to the first and second electrically conductive electrodes of each sensor unit.

12. The system according to claim 10, further comprising a deformation detecting device arranged on the structural component to detect a deformation of the structural component.

13. An aircraft having a system according to claim 10.

14. A method for the detection of damage of a structural component according to claim 1, comprising:
    providing the structural component of claim 1;
    generating shear forces along boundary surfaces of the material layers by mechanical deformation of the structural component;
    detecting an electrical voltage at the first and second electrically conductive electrodes of the at least one sensor unit of the sensor device over a predetermined period of time; and
    analyzing a resulting plot of the electrical voltage over the predetermined period of time in regard to the existence of a damage criterion indicative of damage.

15. The method according to claim 14, wherein the damage criterion is fulfilled by a change in the voltage plot, by a change in the voltage plot as compared to a plot of a deformation of the structural component detected over the predetermined period of time, or by a deviation of the voltage plot in a first partial period of time of the predetermined period of time from the voltage plot in a second, later partial period of time of the predetermined period of time.

* * * * *